(12) United States Patent
Li et al.

(10) Patent No.: US 12,105,157 B2
(45) Date of Patent: Oct. 1, 2024

(54) LEAKAGE CURRENT DETECTION AND INTERRUPTION DEVICE FOR POWER CORD AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN); Shengyun Nie, Suzhou (CN)

(73) Assignee: Chengli Li, Suzhou (CN)

( * ) Notice: Subject to any disclaimer, the term of this patent is extended or adjusted under 35 U.S.C. 154(b) by 191 days.

(21) Appl. No.: 17/819,283

(22) Filed: Aug. 11, 2022

(65) Prior Publication Data

US 2024/0044998 A1 Feb. 8, 2024

(51) Int. Cl.
*G01R 31/52* (2020.01)
*H02H 1/00* (2006.01)
*H02H 3/16* (2006.01)

(52) U.S. Cl.
CPC ........... *G01R 31/52* (2020.01); *H02H 1/0007* (2013.01); *H02H 3/16* (2013.01)

(58) Field of Classification Search
CPC ........ G01R 31/52; H02H 1/0007; H02H 3/16; H02H 5/10
USPC ......................................................... 361/42
See application file for complete search history.

(56) References Cited

U.S. PATENT DOCUMENTS

| | | | | |
|---|---|---|---|---|
| 5,514,967 A | * | 5/1996 | Zelm ................... | G01R 31/1227 324/765.01 |
| 5,541,800 A | * | 7/1996 | Misencik ............... | H01H 83/04 361/45 |
| 6,002,563 A | * | 12/1999 | Esakoff .................... | H02H 3/33 361/45 |
| 8,154,831 B2 | * | 4/2012 | Wang ..................... | H01H 83/14 361/42 |
| 9,640,977 B2 | * | 5/2017 | Li ........................... | H02H 3/33 |
| 11,243,265 B2 | * | 2/2022 | Li ........................... | H02H 7/22 |
| 11,600,984 B1 | * | 3/2023 | Li ........................... | H02H 3/16 |
| 2007/0159740 A1 | * | 7/2007 | Williams ................ | H02H 3/33 361/42 |
| 2008/0094764 A1 | * | 4/2008 | Zhang ................ | H01R 13/6691 29/729 |

(Continued)

FOREIGN PATENT DOCUMENTS

WO WO-2010011321 A1 * 1/2010 ............... H02H 3/16

*Primary Examiner* — Dharti H Patel
(74) *Attorney, Agent, or Firm* — Chen Yoshimura LLP

(57) ABSTRACT

A leakage current detection and interruption (LCDI) device includes a switch module to control electrical connection of first and second power supply lines between input and output ends, a leakage current detection module including first and second leakage current detection lines respectively covering the first and second power supply lines to detect leakage currents thereon, a detection monitoring module coupled to the leakage current detection module and the first and second power supply lines to generate an open circuit detection signal in response to an open circuit condition in the first or second leakage current detection line, and a test module including a normally closed test switch coupled to the first or second leakage current detection line, wherein when the test switch is manually operated to open, the switch module disconnects the first and second power supply lines between the input and output ends.

15 Claims, 5 Drawing Sheets

(56) References Cited

U.S. PATENT DOCUMENTS

| | | | |
|---|---|---|---|
| 2010/0020452 A1* | 1/2010 | Gandolfi | H02H 3/16 |
| | | | 361/42 |
| 2016/0111869 A1* | 4/2016 | Li | H02H 3/33 |
| | | | 361/42 |
| 2020/0393520 A1* | 12/2020 | Li | G01R 31/58 |
| 2021/0210946 A1* | 7/2021 | Li | H02H 3/33 |
| 2021/0265832 A1* | 8/2021 | Li | H02H 3/335 |
| 2021/0313796 A1* | 10/2021 | Li | H02H 1/0007 |
| 2022/0011378 A1* | 1/2022 | Li | G01R 31/54 |

* cited by examiner

LEAKAGE CURRENT DETECTION AND INTERRUPTION DEVICE FOR POWER CORD AND RELATED ELECTRICAL CONNECTORS AND ELECTRICAL APPLIANCES

BACKGROUND OF THE INVENTION

This invention relates to electrical circuits, and in particular, it relates to a leakage current detection and interruption (LCDI) device for a power cord, and related electrical connectors and electrical appliances.

Leakage current detection and interruption (LCDI) device is a fire hazard prevention device for electrical appliances. Its is implemented in a power cord with a plug, and functions to detect any leakage current between the hot and neutral power supply lines and their shield layers along the power cord from the plug to the electrical load (e.g., air conditioner, dehumidifier, etc.). When a leakage current is detected, the LCDI device can disconnect the electrical power from the power source to the appliance, preventing fire hazard and ensuring safety. Thus, LCDI devices can prevent fire hazard caused by arc fault due to physical damage and lost of insulation in the power cord, which may be caused by aging of the hot, neutral and ground wires, wear, pinching, animal chewing, etc.

In some conventional LCDI devices, when the leakage current detection lines (shield lines) have an open circuit condition and cannot provide protection, the devices can still operate to connect power to the load. This is a potential safety threat and may cause fire hazard.

Thus, an LCDI device that can detect fault conditions of the leakage current detection lines is needed.

SUMMARY OF THE INVENTION

Accordingly, the present invention is directed to an LCDI device which includes: a switch module, configured to control an electrical connection of the first power supply line and second power supply line between an input end and an output end; a leakage current detection module, including a first leakage current detection line and a second leakage current detection line, wherein the first leakage current detection line covers the first power supply line and is configured to detect a leakage current from the first power supply line and to generate a first leakage current signal, and wherein the second leakage current detection line covers the second power supply line and is configured to detect a leakage current from the second power supply line and to generate a second leakage current signal; a detection monitoring module, coupled to the leakage current detection module, the first power supply line and the second power supply line, configured to generate an open circuit detection signal in response to an open circuit condition in the first leakage current detection line or the second leakage current detection line; and a test module, including at least one test switch coupled to the first leakage current detection line or the second leakage current detection line, wherein the at least one test switch is a normally closed switch and is configured to be manually operated to open, and wherein when the at least one test switch is open, the switch module disconnects the first and second power supply lines between the input end and the output end.

In some embodiments, the LCDI device further includes a drive module, coupled to the switch module, the leakage current detection module and the detection monitoring module, configured to drive the switch module to disconnect the first and second power supply lines between the input end and the output end in response to the first or second leakage current signal.

In some embodiments, the drive module is further configured to drive the switch module to disconnect the first and second power supply lines between the input end and the output end in response to the open circuit detection signal generated by the detection monitoring module.

In some embodiments, the detection monitoring module includes at least one resistor coupled to the leakage current detection module, the first power supply line and the second power supply line.

In some embodiments, the drive module includes: a solenoid, configured to generate an electromagnetic force in response to a current flowing therethrough to drive the switch module; and at least one semiconductor device, coupled in series with the solenoid, and coupled to the detection monitoring module, configured to cause a current to flow through the solenoid in response to a leakage fault signal and/or an open circuit fault signal.

In some embodiments, the drive module further includes: a comparator unit, configured to define a threshold signal; wherein in response to a first output signal from the detection monitoring module that is below the threshold signal, the comparator unit prevents the semiconductor device from driving the switch module to disconnect the first and second power supply lines between the input end and the output end; and wherein in response to a second output signal from the detection monitoring module that is above the threshold signal, the comparator unit generates the leakage fault signal and/or the open circuit fault signal, and wherein the detection monitoring module generates the second output signal in response to at least one of the first leakage current signal, the second leakage current signal, and the open circuit detection signal.

In some embodiments, the comparator unit is selected from a group consisting of: a Zener diode, a trigger diode, a comparator, a TVS (Transient Voltage Suppressor) diode, and a photocoupler.

In some embodiments, the semiconductor device is selected from a group consisting of: a silicon controlled rectifier, a bipolar transistor, a field effect transistor, and a photocoupler.

In some embodiments, the drive module further includes: a half-bridge rectifier unit, coupled to the solenoid and the semiconductor device, configured to provide a rectified drive current to the solenoid; or a full-bridge rectifier unit, coupled to the solenoid and the semiconductor device, configured to provide a rectified drive current to the solenoid.

In a second aspect, the present invention provides an electrical power connection device, which includes: a body; and a leakage current detection and interruption device described above, disposed inside the body.

In a third aspect, the present invention provides an electrical appliance, which includes: an electrical load; and an electrical power connection device coupled between a power supply and the electrical load, configured to supply power to the electrical load, wherein the electrical power connection device includes a leakage current detection and interruption device described above.

In the LCDI device according to embodiments of the present invention, the two first leakage current detection lines respectively cover the two power supply lines, and form a leakage current detection path together with the detection monitoring module, the test module and the drive module. The device can separately detect leakage currents on the two power supply lines and the open circuit conditions of the two leakage current detection lines. Further, the LCDI device can effectively prevent accidental trip when there is no leakage fault, by providing a low voltage at the control gate of the semiconductor device in the drive module, which enhances reliability of the normal operation of the device. Moreover, the LCDI device according to embodiments of the present invention have the advantages of a simple circuit structure, low cost and high safety.

BRIEF DESCRIPTION OF DRAWINGS

Preferred embodiments of the present invention are described with reference to the drawings. These drawings serve to explain the embodiments and their operating principle, and only illustrate structures that are necessary to the understanding of the principles of the invention. These drawings are not necessarily to scale. In the drawings, like features are designated by like reference symbols.

DETAILED DESCRIPTION OF THE INVENTION

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc.

A main technical problem solved by embodiments of the present invention is the operation stability of the LCDI device.

To solve the problem, embodiments of the present invention provides an LCDI device, which includes: a switch module, configured to control an electrical connection of the first power supply line and second power supply line between an input end and an output end; a leakage current detection module, including a first leakage current detection line which covers the first power supply line and is configured to detect a leakage current from the first power supply line and to generate a first leakage current signal, and a second leakage current detection line which covers the second power supply line and is configured to detect a leakage current from the second power supply line and to generate a second leakage current signal; a detection monitoring module, coupled to the leakage current detection module, the first power supply line and the second power supply line, configured to generate an open circuit detection signal in response to an open circuit condition in the first leakage current detection line or the second leakage current detection line; and a test module, including at least one test switch coupled to the first leakage current detection line or the second leakage current detection line, wherein the at least one test switch is a normally closed switch and is configured to be manually operated to open, and wherein when the at least one test switch is open, the switch module disconnects the first and second power supply lines between the input end and the output end.

Figure 1:
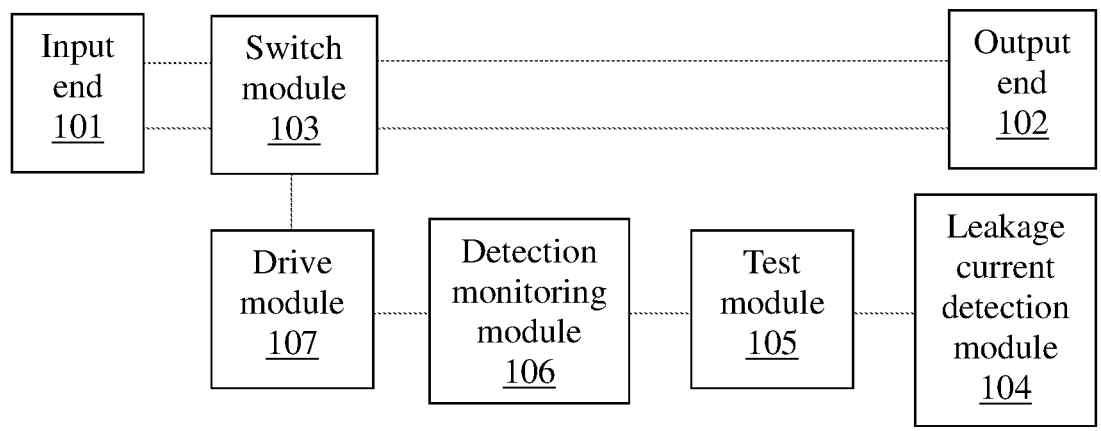
FIG. 1 is a block diagram of an LCDI device according to embodiments of the present invention.

FIG. 1 is a block diagram of an LCDI device according to embodiments of the present invention. As shown in FIG. 1, the LCDI device for power cord 100 includes a switch module 103, a leakage current detection module 104, a test module 105, a detection monitoring module 106, and a drive module 107. The switch module 103 controls the electrical connection between the input end 101 and output end 102. The leakage current detection module 104 includes a first leakage current detection line and a second leakage current detection line. The first leakage current detection line covers the first power supply line of the power cord, and detects a first leakage current on the first power supply line. The second leakage current detection line covers the second power supply line of the power cord, and detects a second leakage current on the second power supply line. The detection monitoring module 106 is coupled to the leakage current detection module 104 and the first and second power supply lines, and is configured to generate an open circuit detection signal when at least one of the first and second leakage current detection lines has an open circuit condition. The test module 105 is coupled between the leakage current detection module 104 and the detection monitoring module 106, and can control the switch module 103 to disconnect the power between the input and output ends. The drive module 107 is coupled to the switch module 103, the leakage current detection module 104 and the detection monitoring module 106, and is configured to drive the switch module 103 to disconnect the power between the input and output ends when the first and/or second leakage current detection line detects a leakage current. In the LCDI device 100, the two leakage current detection lines respectively cover two power supply lines and form leakage current detection paths with the test module 105, detection monitoring module 106 and the drive module 107. Thus, the LCDI device 100 can detect the leakage currents on the two power supply lines, and detect the open circuit conditions on the two leakage current detection lines.

In some embodiments, the drive module 107 is further configured to drive the switch module 103 to disconnect power to the output end when the first leakage current detection line and/or the second leakage current detection line has an open circuit condition. The drive module 107 functions, on the one hand, to disconnect power to the output end when a leakage current is detected, and on the other hand, to detect whether the first and/or second leakage current detection line has a fault (e.g., an open circuit), and to disconnect power to the output end when such a fault is present. This enhances the reliability of the LCDI device 100.

In some embodiments, the detection monitoring module 106 includes at least one resistor, coupled to the leakage current detection module 104 and the first and second leakage current detection lines. The detection monitoring module 106 functions to regulate the control signal provided to the drive module 107 in order to prevent accidental tripping of the drive module 107.

In some embodiments, the drive module 107 includes a solenoid and at least one semiconductor device. The solenoid generates an electromagnetic force to drive the switch module 103. The semiconductor device is coupled to the solenoid and the detection monitoring module 106, and causes the solenoid to generate the electromagnetic force to open the switch module 103 in response to a leakage fault signal and/or open circuit fault signal. The semiconductor device may be a silicon trolled rectifier, a bipolar transistor, a field-effect transistor, a photocoupler, etc.

In some embodiments, the drive module 107 further includes a comparator unit, configured to define a threshold signal. When the output of the detection monitoring module 106 is below the threshold signal, the comparator unit prevents the semiconductor device from controlling the solenoid to drive the switch module to disconnect power to the output. When at least one of the first leakage current signal, second leakage current signal, and open circuit detection signal is above the threshold signal, the comparator unit generates the leakage fault signal and/or open circuit fault signal to control the semiconductor device. The comparing unit may be a Zener diode, a trigger diode, a comparator, a TVS (Transient Voltage Suppressor) diode, a photocoupler, etc.

In some embodiment, the drive module 107 includes a half-bridge rectifier or a full-bridge rectifier, coupled to the solenoid and the semiconductor device, configured to provide a rectified drive current to the solenoid.

First Embodiment

Figure 2:
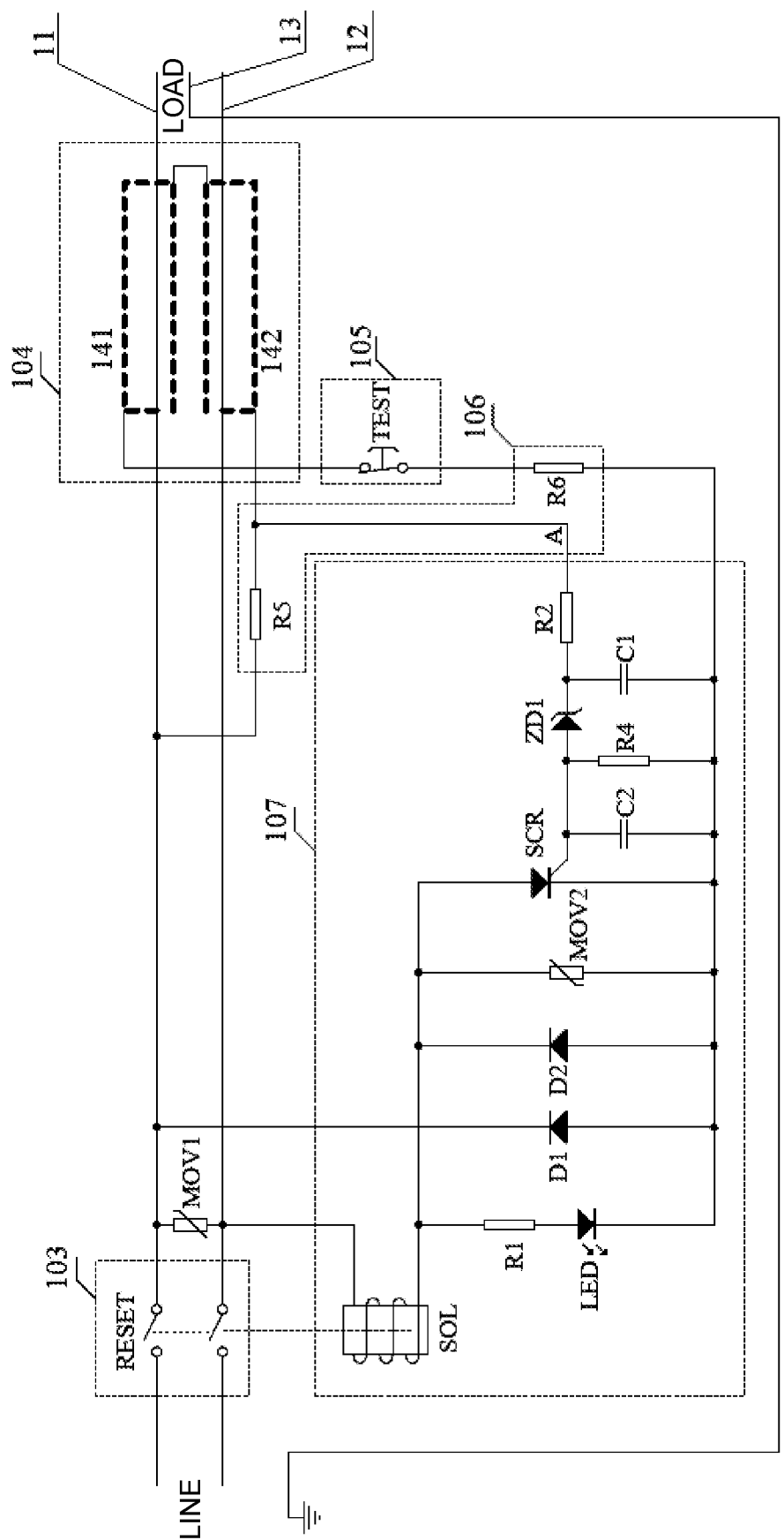
FIG. 2 is a circuit diagram of an LCDI device according to a first embodiment of the present invention.

FIG. 2 is a circuit diagram of a power cord with an LCDI device according to a first embodiment of the present invention. As shown in FIG. 2, the LCDI device includes a switch module 103, a leakage current detection module 104, a test module 105, a detection monitoring module 106, and a drive module 107. The switch module 103 include a reset switch RESET, configured to control the electrical connection and disconnection between the input end LINE and output end LOAD. The power cord includes a first power supply line 11 (e.g., hot line), a second power supply line 12 (e.g., neutral line), and a third power supply line 13 (e.g., ground line). The leakage current detection module 104 includes at least a first leakage current detection line 141 and a second leakage current detection line 142, respectively covering the first power supply line 11 and second power supply line 12. In this embodiment, the first ends of the first leakage current detection line 141 and second leakage current detection line 142 are the ends farther away from the output end (LOAD), i.e. the left end in FIG. 2; their second ends are the ends closer to the output end, i.e. the right end in FIG. 2.

As shown in FIG. 2, the first leakage current detection line 141 and second leakage current detection line 142 are coupled in series. The first end the second leakage current detection line 142 is coupled to one end of a resistor R5 of the detection monitoring module 106 at point A. The other end of resistor R5 is coupled to the first power supply line 11. The first end the first leakage current detection line 141 is coupled via the test module 105 (e.g., a normally closed test switch TEST) to one end of a resistor R6 of the detection monitoring module 106. The other end of resistor R6 is coupled to the cathode of the silicon controlled rectifier SCR of the drive module 107, to one end of a capacitor C2, and to anodes of diodes D1 and D2. In the drive module 107, one end of a Zener diode ZD1 is coupled to point A via a resistor R2, the other end of the Zener diode ZD1 is coupled to the control electrode of the silicon controlled rectifier SCR. The capacitor C2 is coupled between the control electrode and cathode of the silicon controlled rectifier SCR. The cathode of the silicon controlled rectifier SCR is coupled to the anodes of diodes D1 and D2, and the anode of the silicon controlled rectifier SCR is coupled to the cathode of diode D2 and one end of a solenoid SOL. The other end of the solenoid SOL is coupled to the second power supply line 12, to which the reset switch RESET is also coupled. The cathode of diode D1 is coupled to the first power supply line 11, to which the reset switch RESET is also coupled.

When both the first leakage current detection line 141 and second leakage current detection line 142 are operating normally (i.e., no open circuit condition), a current flows from the first power supply line 11 through a current path formed by R5-142-141-TEST-R6-D2-SOL to the second power supply line 12. By appropriately setting the resistance values of resistors R5 and R6, the voltage at point A is limited to below the threshold voltage of the Zener diode ZD1 (the Zener diode ZD1 is an example of a comparator unit which defines a threshold signal); thus, the voltage at the control electrode of the silicon controlled rectifier SCR is maintained at a very low level, which ensures that the silicon controlled rectifier SCR will not be accidentally triggered and the LCDI device will not accidentally trip. In this condition, the switch module 103 is in the closed state and the LCDI device functions normally to supply power to the load.

When there is current leak from the first power supply line 11 to the first leakage current detection line 141 (first leakage current signal), or from the second power supply line 12 to the second leakage current detection line 142 (second leakage current signal), the voltage at point A rises to above the threshold of the Zener diode ZD1, a current flows from the first power supply line 11 through 141-142-R2-ZD1, and the silicon controlled rectifier SCR is triggers to become conductive. Here, the elevated voltage at point A is referred to as the leakage signal generated by the detection monitoring module 106 in response to the leak on the power supply lines 11 or 12, and the voltage at the anode of the Zener diode ZD1 is referred to as the leakage fault signal generated in response to the leakage signal. When the silicon controlled rectifier SCR is conductive, a relatively large current flows through the solenoid SOL, generating a sufficiently large magnetic field to drive the reset switch RESET of the switch module 103 to trip, thereby disconnecting the electrical connection between the input end LINE and output end LOAD. This way, the LCDI device can detect the current leak of the power supply lines 11 and 12.

When the first leakage current detection line 141 or the second leakage current detection line 142 has an open circuit, resistor R6 loses its voltage division function, so the voltage at point A rises to above the threshold of the Zener diode ZD1. A current flows from the first power supply line 11 through R5-R2-ZD1, and the silicon controlled rectifier SCR is triggered to become conductive. Here, the elevated voltage at point A is referred to as the open circuit detection signal generated by the detection monitoring module 106 in response to the open circuit condition on the leakage current detection lines 141 or 142, and the voltage at the anode of the Zener diode ZD1 is referred to as the open circuit fault signal generated in response to the open circuit detection signal. As a result, the solenoid SOL drives the reset switch RESET of the switch module 103 to trip, thereby disconnecting the electrical connection between the input end LINE and output end LOAD. This way, the LCDI device can detect whether the first leakage current detection line 141 or the second leakage current detection line 142 has a an open circuit fault.

The test module 105 may be used to test whether the other modules of the LCDI 100 has a fault. In this embodiment, when all components of the LCDI device are functioning normally and no leakage current is present between the first leakage current detection line 141 and first power supply line 11 or between second leakage current detection line 142 and the second power supply line 12, the Zener diode ZD1 cannot trigger the silicon controlled rectifier SCR to become conductive, and the LCDI device functions normally to supply power to the output end.

In the normal condition, when the normally closed test switch TEST is manually opened by a user (e.g. by pressing the switch), resistor R6 loses its voltage division function, so the voltage at point A rises to above the threshold of the Zener diode ZD1. A current flows formed first power supply line 11 through R5-R2-ZD1, and the silicon controlled rectifier SCR is triggered to become conductive. As a result, the solenoid SOL drives the reset switch RESET of the switch module 103 to trip, thereby disconnecting the electrical connection between the input end LINE and output end LOAD. This way, the user can operate the test switch TEST to determine whether the LCDI device is functioning normally.

Second Embodiment

Figure 3:
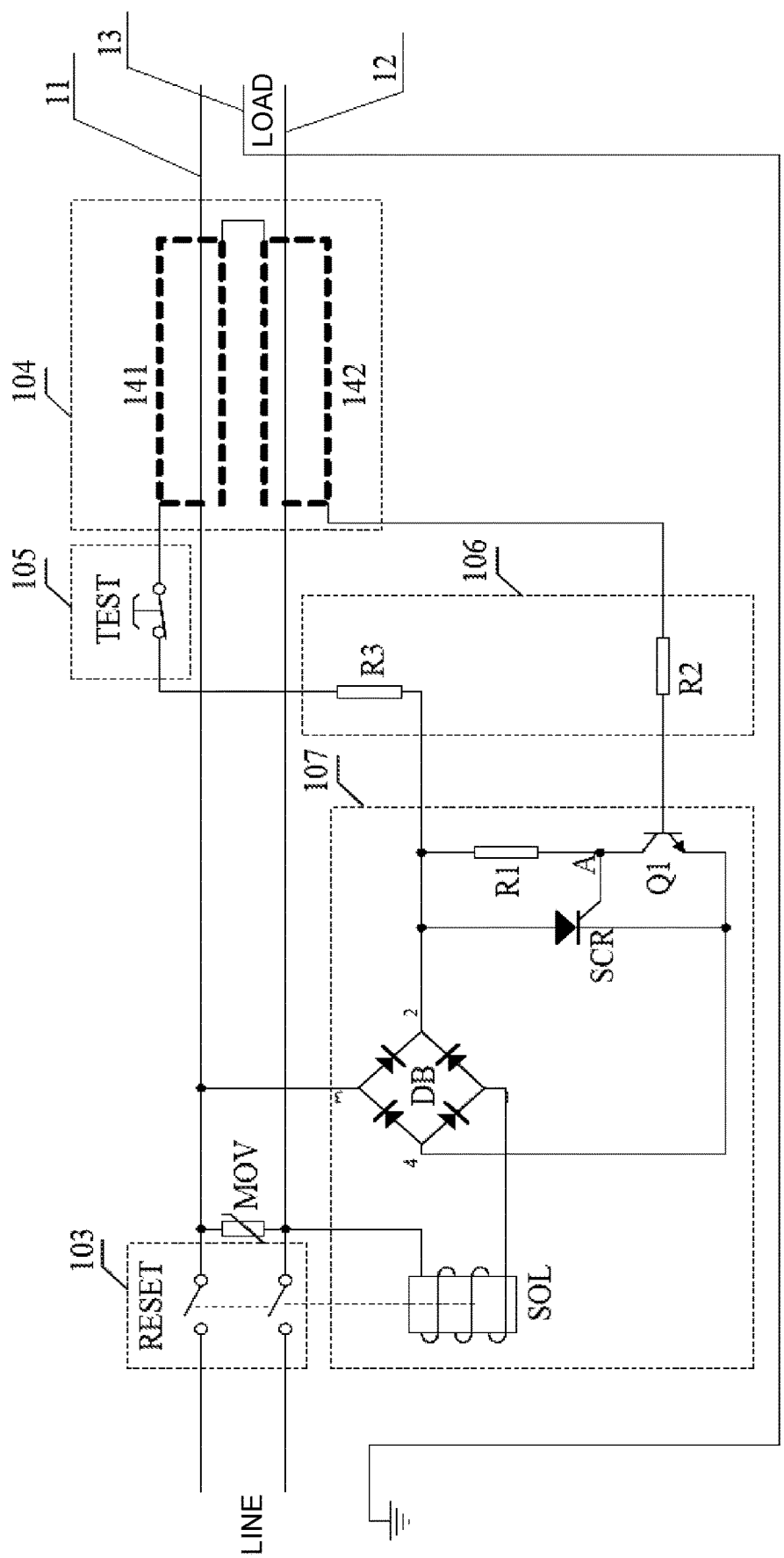
FIG. 3 is a circuit diagram of an LCDI device according to a second embodiment of the present invention.

FIG. 3 is a circuit diagram of an LCDI device according to a second embodiment of the present invention. This embodiment is similar to embodiment of FIG. 2 with the following main differences. In the embodiment of FIG. 3, one end of a resistor R3 of the detection monitoring module 106 is coupled via a full-bridge rectifier circuit DB to the first power supply line 11. The other end of resistor R3 is coupled via the test module 105 (e.g., a normally closed test switch TEST) to the first end of the first leakage current detection line 141. The first end of the second leakage current detection line 142, which is couple din series with the first leakage current detection line 141, is coupled to one end of resistor R2 of the detection monitoring module 106, and the other end of resistor R2 is coupled to the base of a transistor Q1 of the drive module 107. The collector of the transistor Q1 is coupled to the control electrode of the silicon controlled rectifier SCR and to one end of a resistor R1 at point A. The other end of resistor R1 is coupled to the full-bridge rectifier circuit DB, the anode of the silicon controlled rectifier SCR, and one end of resistor R3. The cathode of the silicon controlled rectifier SCR is coupled to the solenoid SOL via the full-bridge rectifier circuit DB.

When both the first leakage current detection line 141 and second leakage current detection line 142 are operating normally (i.e., no open circuit condition), a current flows from the first power supply line 11 through a current path formed by DB-R3-TEST-141-142-R2-Q1-DB-SOL to the second power supply line 12. When the current flows through the transistor Q1, the transistor Q1 becomes conductive, so that the voltage at the control electrode of the silicon controlled rectifier SCR (point A) is maintained at a very low level, which ensures that the silicon controlled rectifier SCR is not accidentally triggered and the LCDI device does not accidentally trip. Thus, the switch module 103 is in the closed state and the LCDI device functions normally to supply power to the output end.

When a leakage current is present on the first power supply line 11 (first leakage current signal) and the second power supply line 12 is in the positive half-cycle of the AC power, a current flows from the second power supply line 12 through a current path formed by SOL-DB-R3-TEST-141 to the first power supply line 11. The resistance values of resistors R3 and R2 are set such that when the first leakage current signal exceeds a predetermined threshold, the current flowing through resistor R2 cannot drive transistor Q1, so the transistor Q1 is in an off state. As a result, the voltage at point A rises, a current flows from the second power supply line 12 through SOL-DB-R1, the silicon controlled rectifier SCR is triggered, which in turn drives the solenoid SOL to cause the switch module 103 to disconnect the power between the input end LINE and the output end LOAD.

Similarly, when a leakage current is present on the second power supply line 12 (second leakage current signal) and the first power supply line 11 is in the positive half-cycle of the AC power, a current flows from the first power supply line 11 through a current path formed by SOL-DB-R3-TEST-141-142 to the second power supply line 12. The resistance values of resistors R3 and R2 are set such that when the second leakage current signal exceeds a predetermined threshold, the current flowing through resistor R2 cannot drive transistor Q1, so that the transistor Q1 is off. Thus, the voltage at point A rises, a current flows from the first power supply line 11 through DB-R1, the silicon controlled rectifier SCR is triggered, which in turn drives the solenoid SOL to cause the switch module 103 to disconnect the power between the input end LINE and the output end LOAD.

This way, the LCDI device can independently detect whether the first leakage current detection line 141 and second leakage current detection line 142 has a leakage fault.

When the first leakage current detection line 141 or the second leakage current detection line 142 has an open circuit, no current flows through resistor R2 to drive the transistor Q1, so the transistor Q1 is off. As a result, the voltage at point A rises, a current flows from the first or second power supply line through DB-R1, the silicon controlled rectifier SCR is triggered, which in turn drives the solenoid SOL to cause the switch module 103 to disconnect the power between the input end LINE and the output end LOAD.

The test module 105 may be used to test whether the other modules of the LCDI 100 has a fault. In this embodiment, when all components of the LCDI device are functioning normally and no leakage current is present between the first leakage current detection line 141 and first power supply line 11 or between the second leakage current detection line 142 and the second power supply line 12, the transistor Q1 cannot trigger the silicon controlled rectifier SCR to become conductive, and the LCDI device functions normally to supply power to the output end.

In the normal condition, when the normally closed test switch TEST is manually opened by a user (e.g. by pressing the switch), no current flows through resistor R2 to drive the transistor Q1, so transistor Q1 is off. As a result, the voltage at point A rises, a current flows from the first or second power supply line through DB-R1, the silicon controlled rectifier SCR is triggered, which in turn drives the solenoid SOL to cause the switch module 103 to disconnect the power between the input end LINE and the output end LOAD. This way, the user can operate the test switch TEST to determine whether the LCDI device is functioning normally.

Third Embodiment

Figure 4:
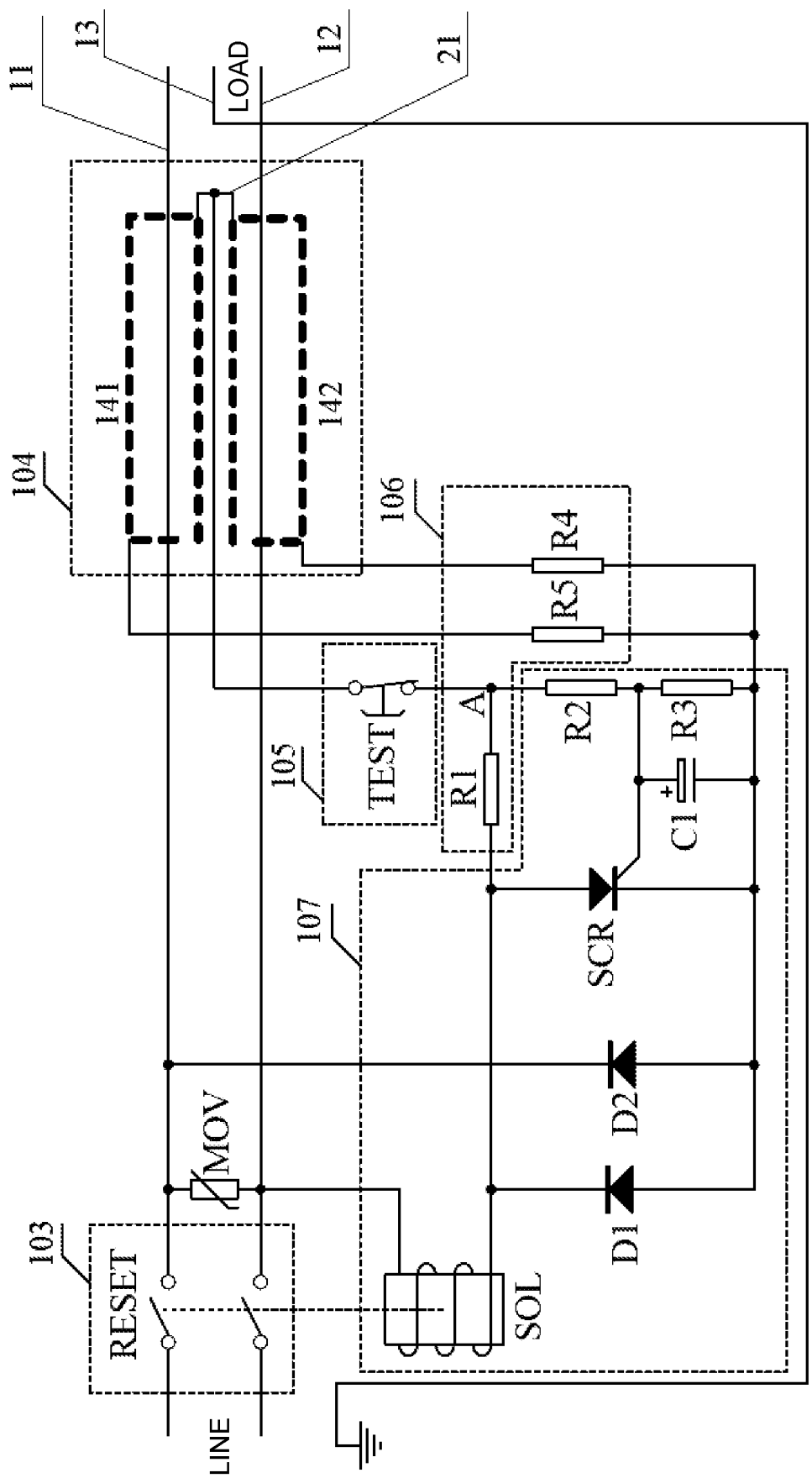
FIG. 4 is a circuit diagram of an LCDI device according to a third embodiment of the present invention.

FIG. 4 is a circuit diagram of an LCDI device according to a third embodiment of the present invention. In this embodiment, the leakage current detection module 104 includes a first leakage current detection line 141, a second leakage current detection line 142, and a connector line 21. The first leakage current detection line 141 covers the first power supply line 11, and the second leakage current detection line 142 covers the second power supply line 12. Similar to the embodiment of FIG. 2, in FIG. 4, the first ends of the first leakage current detection line 141, the second leakage current detection line 142 and the connector line 21 are the ends farther away from the output end (LOAD), i.e. the left end in FIG. 4; their second ends are the ends closer to the output end, i.e. the right end in FIG. 4.

As show in FIG. 4, the second end of the first leakage current detection line 141, the second end of the second leakage current detection line 142, and the second end of the connector line 21 are coupled together. The first end of the first leakage current detection line 141 is coupled to one end of a resistor R5 of the detection monitoring module 106. The first end of the connector line 21 is coupled to one end of the test module 105 (e.g., a normally closed test switch TEST). The first end of the second leakage current detection line 142 is coupled to one end of a resistor R4 of the detection monitoring module 106. The other end of the test module 105 is coupled to one end of a resistor R1 of the detection monitoring module 106 at point A. The other end of resistor R5 and the other end of resistor R4 are both coupled to one end of a resistor R3 of the drive module 107, one end of a capacitor C1, the cathode of a silicon controlled rectifier SCR, and the anodes of diodes D2 and D1. One end of a resistor R2 of the drive module 107 is coupled to point A, and its other end is coupled to the other end of resistor R3 and the control electrode of the silicon controlled rectifier SCR. The capacitor C1 is coupled between the control electrode and cathode of the silicon controlled rectifier SCR. The anode of the silicon controlled rectifier SCR and the cathode of diode D1 are both coupled to one end of the solenoid SOL.

When both the first leakage current detection line 141 and second leakage current detection line 142 are operating normally (i.e., no open circuit condition), a current flows from the second power supply line 12 through a current path formed by SOL-R1-TEST-21-141-R5-D2 to the first power supply line 11. Similarly, a current flows from the second power supply line 12 through a current path formed by SOL-R1-TEST-21-142-R4-D2 to the first power supply line 11. The resistance values of resistors R1, R4 and R5 are set such that the voltage at point A is low, and after voltage division by resistors R2 and R3, the voltage at the control electrode of the silicon controlled rectifier SCR is maintained at a very low level, which ensures that the silicon controlled rectifier SCR will not be accidentally triggered and the LCDI device will not accidentally trip. In this condition, the switch module 103 is in the closed state and the device functions normally to supply power to the load.

When a leakage current is present on the first power supply line 11 (first leakage current signal) or the second power supply line 12 (second leakage current signal), the voltage at point A rises to above a predetermined threshold, a current flows from first or second power supply line through resistor R2 and the silicon controlled rectifier SCR is triggered, which in turn drives the solenoid SOL to cause the switch module 103 to disconnect the power between the input end LINE and the output end LOAD.

When at least one of the first and second leakage current detection lines 141, 142 has an open circuit, the voltage at point A rises, a current flows from the second power supply line 12 through SOL-R1-R2 and the silicon controlled rectifier SCR is triggered, which in turn drives the solenoid SOL to cause the switch module 103 to disconnect the power between the input end LINE and the output end LOAD.

The test module 105 may be used to test whether the other modules of the LCDI 100 has a fault. In this embodiment, when all components of the LCDI device are functioning normally and no leakage current is present between the first leakage current detection line 141 and first power supply line 11 or between second leakage current detection line 142 and the second power supply line 12, resistor R2 cannot trigger the silicon controlled rectifier SCR to become conductive, and the LCDI device functions normally to supply power to the output end.

In the normal condition, when the normally closed test switch TEST is manually opened by a user (e.g. by pressing the switch), the voltage at point A rises, a current flows from the second power supply line 12 through SOL-R1-R2 and the silicon controlled rectifier SCR is triggered, which in turn drives the solenoid SOL to cause the switch module 103 to disconnect the power between the input end LINE and the output end LOAD. This way, the user can operate the test switch TEST to determine whether the LCDI device is functioning normally.

Fourth Embodiment

Figure 5:
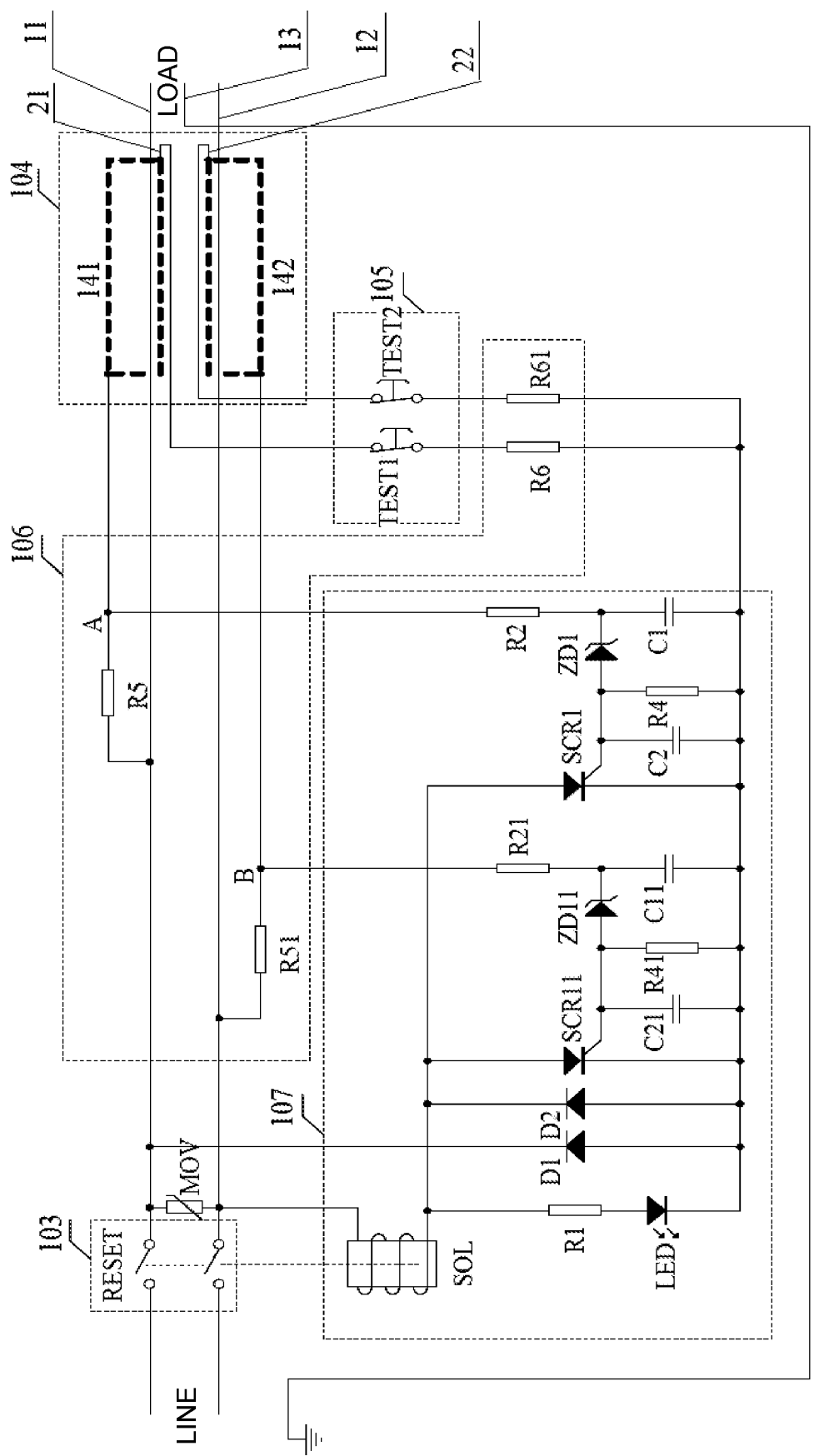
FIG. 5 is a circuit diagram of an LCDI device according to a fourth embodiment of the present invention.

FIG. 5 is a circuit diagram of an LCDI device according to a fourth embodiment of the present invention. In this embodiment, the leakage current detection module 104 includes a first leakage current detection line 141, a second leakage current detection line 142, and first and second connector lines 21 and 22. The first leakage current detection line 141 covers the first power supply line 11, and the second leakage current detection line 142 covers the second power supply line 12. In FIG. 5, the first ends of the first leakage current detection line 141, the second leakage current detection line 142 and the connector lines 21 and 22 are the ends farther away from the output end (LOAD), i.e. the left end in FIG. 5; their second ends are the ends closer to the output end, i.e. the right end in FIG. 5.

The second end of the first leakage current detection line 141 is coupled to the second end of the connector line 21, and the second end of the second leakage current detection line 142 is coupled to the second end of the connector line 22. The first end of the first leakage current detection line 141 is coupled to one end of a resistor R5 of the detection monitoring module 106 at point A. The first end of the second leakage current detection line 142 is coupled to one end of a resistor R51 of the detection monitoring module 106 at point B. The first end of the first connector line 21 is coupled via the first test switch TEST1 of the test module 105 to resistor R6 of the detection monitoring module 106, and the first end of the second connector line 22 is coupled via the second test switch TEST2 of the test module 105 to resistor R61 of the detection monitoring module 106.

The resistors R6 and R61 of the detection monitoring module 106 are both coupled to the drive module 107, namely to capacitors C1, C2, C11 and C21, to the cathode of the first silicon controlled rectifier SCR1 and the cathode of the second silicon controlled rectifier SCR11, and to the anodes of diodes D1 and D2. A resistor R2 of the drive module 107 is coupled between point A and the cathode of a first Zener diode ZD1. Capacitor C1 is coupled between the cathode of the first Zener diode ZD1 and resistor R6. The anode of the first Zener diode ZD1 is coupled to the control electrode of the first silicon controlled rectifier SCR1. Capacitor C2 is coupled between the control electrode and cathode of the first silicon controlled rectifier SCR1. The anode of the first silicon controlled rectifier SCR1 is coupled to the solenoid SOL. A resistor R21 of the drive module 107 is coupled between point B and the cathode of a second Zener diode ZD11. Capacitor C11 is coupled between the cathode of the second Zener diode ZD11 and resistor R61. The anode of the second Zener diode ZD11 is coupled to the control electrode of the second silicon controlled rectifier SCR11. Capacitor C21 is coupled between the control electrode and the cathode of the second silicon controlled rectifier SCR11. The anode of the second silicon controlled rectifier SCR11 is coupled to the solenoid SOL.

When both the first leakage current detection line 141 and second leakage current detection line 142 are operating normally (i.e., no open circuit condition), a current flows from the first power supply line 11 through a current path formed by R5-141-21-TEST1-R6-D2-SOL to the second power supply line 12. The resistance values of resistors R5 and R6 are set such that the voltage at point A is low, below the threshold voltage of the first Zener diode ZD1, so the voltage at the control electrode of the first silicon controlled rectifier SCR1 is maintained at a very low level, which ensures that the first silicon controlled rectifier SCR1 will not be accidentally triggered and the LCDI device will not accidentally trip. Similarly, a current flows from the second power supply line 12 through a current path formed by R51-142-22-TEST2-R61-D1 to the first power supply line 11. The resistance values of resistors R51 and R61 are set such that the voltage at point B is low, below the threshold voltage of the second Zener diode ZD11, so the voltage at the control electrode of the second silicon controlled rectifier SCR11 is maintained at a very low level, which ensures that the second silicon controlled rectifier SCR11 will not be accidentally triggered and the LCDI device will not accidentally trip. In this condition, the switch module 103 is in the closed state and the device functions normally to supply power to the load.

When a leakage current is present between the first power supply line 11 and the first leakage current detection line 141, the voltage at point A rises, a current flows from the first power supply line 11 through 141-R2-ZD1, and the first silicon controlled rectifier SCR1 is triggered, which in turn drives the solenoid SOL to cause the switch module 103 to disconnect the power between the input end LINE and the output end LOAD. Similarly, when a leakage current is present between the second power supply line 12 and the second leakage current detection line 142, the voltage at point B rises, a current flows from the second power supply line 12 through 142-R21-ZD11, and the second silicon controlled rectifier SCR11 is triggered, which in turn drives the solenoid SOL to cause the switch module 103 to disconnect the power between the input end LINE and the output end LOAD.

When the first leakage current detection line 141 has an open circuit, or the normally closed first test switch TEST1 is manually operated by the user to become open, resistor R6 loses its voltage division function, and the voltage at point A rises. A current flows from the first power supply line 11 through R5-R2-ZD1 and the first silicon controlled rectifier SCR1 is triggered, which in turn drives the solenoid SOL to cause the switch module 103 to disconnect the power between the input end LINE and the output end LOAD.

Similarly, when the second leakage current detection line 142 has an open circuit, or the normally closed second test switch TEST2 is manually operated by the user to become open, resistor R61 loses its voltage division function, and the voltage at point B rises. A current flows from the second power supply line 12 through R51-R21-ZD11 and the second silicon controlled rectifier SCR11 is triggered, which in turn drives the solenoid SOL to cause the switch module 103 to disconnect the power between the input end LINE and the output end LOAD.

In a second aspect, the present invention provides an electrical power connection device, which includes a body, and a leakage current detection and interruption device of any of the above embodiments disposed inside the body.

In a third aspect, the present invention provides an electrical appliance, which includes an electrical load and an electrical power connection device coupled between a power supply and the electrical load and configured to supply power to the electrical load, where the electrical power connection device includes a leakage current detection and interruption device of any of the above embodiments.

While the present invention is described above using specific examples, these examples are only illustrative and do not limit the scope of the invention. It will be apparent to those skilled in the art that various modifications, additions and deletions can be made to the leakage current detection and interruption device of the present invention without departing from the spirit or scope of the invention.

The invention claimed is:

1. A leakage current detection and interruption (LCDI) device, comprising:
   a first power supply line and a second power supply line;
   a switch module, configured to control an electrical connection of the first power supply line and second power supply line between an input end and an output end;
   a leakage current detection module, including a first leakage current detection line and a second leakage current detection line, wherein the first leakage current detection line covers the first power supply line and is configured to detect a leakage current from the first power supply line and to generate a first leakage current signal, and wherein the second leakage current detection line covers the second power supply line and is configured to detect a leakage current from the second power supply line and to generate a second leakage current signal;
   a detection monitoring module, coupled to the leakage current detection module, the first power supply line and the second power supply line, configured to generate an open circuit detection signal in response to an open circuit condition in the first leakage current detection line or the second leakage current detection line; and
   a test module, including at least one test switch coupled to the first leakage current detection line or the second leakage current detection line, wherein the at least one test switch is a normally closed switch and is configured to be manually operated to open, and wherein when the at least one test switch is open, the switch module disconnects the first and second power supply lines between the input end and the output end.

2. The LCDI device of claim 1, further comprising:
a drive module, coupled to the switch module, the leakage current detection module and the detection monitoring module, configured to drive the switch module to disconnect the first and second power supply lines between the input end and the output end in response to the first or second leakage current signal.

3. The LCDI device of claim 2, wherein the drive module is further configured to drive the switch module to disconnect the first and second power supply lines between the input end and the output end in response to the open circuit detection signal generated by the detection monitoring module.

4. The LCDI device of claim 2, wherein the drive module includes:
a solenoid, configured to generate an electromagnetic force in response to a current flowing therethrough to drive the switch module; and
at least one semiconductor device, coupled in series with the solenoid, and coupled to the detection monitoring module, configured to cause a current to flow through the solenoid in response to a leakage fault signal and/or an open circuit fault signal.

5. The LCDI device of claim 4, wherein the drive module further includes:
a comparator unit, configured to define a threshold signal;
wherein in response to a first output signal from the detection monitoring module that is below the threshold signal, the comparator unit prevents the semiconductor device from driving the switch module to disconnect the first and second power supply lines between the input end and the output end; and
wherein in response to a second output signal from the detection monitoring module that is above the threshold signal, the comparator unit generates the leakage fault signal and/or the open circuit fault signal, and wherein the detection monitoring module generates the second output signal in response to at least one of the first leakage current signal, the second leakage current signal, and the open circuit detection signal.

6. The LCDI device of claim 5, wherein the comparator unit is selected from a group consisting of: a Zener diode, a trigger diode, a comparator, a TVS (Transient Voltage Suppressor) diode, and a photocoupler.

7. The LCDI device of claim 4, wherein the semiconductor device is selected from a group consisting of: a silicon controlled rectifier, a bipolar transistor, a field effect transistor, and a photocoupler.

8. The LCDI device of claim 4, wherein the drive module further includes:
a half-bridge rectifier unit, coupled to the solenoid and the semiconductor device, configured to provide a rectified drive current to the solenoid; or
a full-bridge rectifier unit, coupled to the solenoid and the semiconductor device, configured to provide a rectified drive current to the solenoid.

9. The LCDI device of claim 1, wherein the detection monitoring module includes at least one resistor coupled to the leakage current detection module, the first power supply line and the second power supply line.

10. An electrical power connection device, comprising:
a body; and
a leakage current detection and interruption device of claim 1, disposed inside the body.

11. An electrical appliance, comprising:
an electrical load; and
an electrical power connection device coupled between a power supply and the electrical load, configured to supply power to the electrical load, wherein the electrical power connection device includes a leakage current detection and interruption device of claim 1.

12. The LCDI device of claim 1, wherein the test module is coupled between the leakage current detection module an the detection monitoring module.

13. The LCDI device of claim 1, wherein the at least one test switch, the first leakage current detection line and the second leakage current detection line are coupled in series with each other.

14. The LCDI device of claim 1, wherein the first and second leakage current detection lines are coupled in parallel with each other, and the at least one test switch is coupled in series with the parallelly coupled first and second leakage current detection lines.

15. The LCDI device of claim 1, wherein the test module includes a first test switch coupled in series with the first leakage current detection line, and a second test switch coupled in series with the second leakage current detection line, wherein both the first and second test switches are normally closed switches and are configured to be manually operated to open, and wherein when either the first or the second test switch is open, the switch module disconnects the first and second power supply lines between the input end and the output end.

* * * * *